US006980066B2

(12) United States Patent
Nakai et al.

(10) Patent No.: US 6,980,066 B2
(45) Date of Patent: Dec. 27, 2005

(54) HIGH-FREQUENCY MODULE

(75) Inventors: Shinya Nakai, Tokyo (JP); Yoshinari Yamashita, Tokyo (JP); Hideaki Ninomiya, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/473,019

(22) PCT Filed: Mar. 27, 2002

(86) PCT No.: PCT/JP02/02961

§ 371 (c)(1),
(2), (4) Date: Sep. 25, 2003

(87) PCT Pub. No.: WO02/080634

PCT Pub. Date: Oct. 10, 2002

(65) Prior Publication Data

US 2004/0113719 A1    Jun. 17, 2004

(30) Foreign Application Priority Data

Mar. 29, 2001   (JP)   ............................. 2001-097027

(51) Int. Cl.[7] ........................... H03H 7/38; H03H 7/46; H01P 3/08
(52) U.S. Cl. ..................... 333/128; 333/132; 333/185
(58) Field of Search ............................... 333/133, 193, 333/246, 247, 128, 132, 185; 361/728, 736, 361/761, 783

(56) References Cited

U.S. PATENT DOCUMENTS

| 5,014,161 | A | * | 5/1991 | Lee et al. .................... 361/709 |
| 5,561,406 | A | * | 10/1996 | Ikata et al. .................. 333/126 |
| 5,699,027 | A | * | 12/1997 | Tsuji et al. .................. 333/193 |
| 5,859,473 | A | * | 1/1999 | Ikata et al. .................. 257/723 |
| 6,094,161 | A | * | 7/2000 | Cassen et al. ............... 342/175 |
| 6,281,446 | B1 | * | 8/2001 | Sakamoto et al. ........... 174/255 |
| 6,335,669 | B1 | * | 1/2002 | Miyazaki et al. ............ 333/247 |
| 6,380,823 | B1 | * | 4/2002 | Ikata et al. .................. 333/133 |
| 6,414,835 | B1 | * | 7/2002 | Wolf et al. .................. 361/302 |
| 6,749,927 | B2 | * | 6/2004 | Cooray ....................... 428/209 |
| 6,756,864 | B2 | * | 6/2004 | Muramatsu .................. 333/133 |

FOREIGN PATENT DOCUMENTS

| EP | 0 837 516 A2 | 4/1998 |
| GB | 2 346 740 | 8/2000 |
| JP | 5-63136 | 3/1993 |

(Continued)

*Primary Examiner*—Dean Takaoka
(74) *Attorney, Agent, or Firm*—Seed IP Law Group PLLC

(57) ABSTRACT

It is an object of the present invention to provide a high-frequency module whose production yield as a complete module can be prevented from being lowered. The high-frequency module according to the present invention includes a main module including a first high-frequency circuit at least a part of which is constituted by a conductive pattern built in a multi-layered substrate and a sub-module including a second high-frequency circuit, and the sub-module is inserted into a cavity formed in the main module. According to the present invention, the main module including the first high-frequency circuit and the sub-module including the second high-frequency circuit are constituted as separate components and the main module and the sub-module are integrated by inserting the sub-module into the cavity formed in the main module. Therefore, it is possible to use only a main module and sub-module that have been inspected after manufacture and found to be non-defective. Accordingly, it is possible to markedly increase the yield of the high-frequency module as a whole.

8 Claims, 10 Drawing Sheets

FOREIGN PATENT DOCUMENTS

| | | |
|---|---|---|
| JP | 05-299906 | 11/1993 |
| JP | 07-030055 | 1/1995 |
| JP | 10-145270 | 5/1998 |
| JP | 11-317582 | 11/1999 |
| JP | 11-340634 | 12/1999 |
| JP | 2000-165007 | 6/2000 |
| JP | 2001/024100 | 1/2001 |
| JP | 2001/053453 | 2/2001 |
| JP | 2001/053545 | 2/2001 |
| WO | WO 94/22281 | 9/1994 |

* cited by examiner (a)

(b)

(c)

(a)

(b)

(a)

(b)

(a)

(b)

HIGH-FREQUENCY MODULE

BACKGROUND OF THE INVENTION

The present invention relates to a high-frequency module and, in particular, such a module having high production yield and excellent general utility.

DESCRIPTION OF THE PRIOR ART

In recent years, the size of information communication terminals, typically cellular phones, has decreased rapidly and size reduction of the various components incorporated into information communication terminals is making a large contribution in this direction. Illustrative examples of components incorporated into an information communication terminal include a power amplifier, a voltage-controlled oscillator (VCO) and the like for a transmitter circuit, a low-noise amplifier, a mixer and the like for a receiver circuit, in addition to a high-frequency switch for switching transmitted and received signals.

Many attempts have been made to further reduce the sizes of components incorporated into information communication terminals by integrally combining two or more components. If two or more components are integrated to fabricate a module in this manner, the area on a mother board required for mounting the components can be reduced in comparison with the case where these components are individually mounted and, therefore, the overall size of the information communication terminal can be reduced.

Although the overall size of the information communication terminal can be reduced by integrating two or more components to fabricate a module in this manner, if too many components are integrated to fabricate a module, there is a risk of the yield of the module being lowered. Specifically, when two or more components are integrated to fabricate a module, if even one of the components incorporated into the module is defective, the module as a whole becomes defective, so that the yield of a module is determined by the product of yields of the components incorporated into the module. For example, if a module is fabricated by incorporating five components each having a yield of 95%, the yield of the module is lowered to about 77% (=$0.95^5$). Thus, in the case where many components are integrated to fabricate a module, there is a problem of the yield of the module as a whole being lowered.

Further, in the case where many components are integrated to fabricate a module, if the characteristics of some components need to be changed, the entire module must be redesigned and, therefore, the module is poor in general utility.

SUMMARY OF THE INVENTION

It is therefore an object of the present invention to provide a high-frequency module whose production yield as a complete module can be prevented from being lowered.

It is another object of the present invention to provide a high-frequency module having excellent general utility.

The above and other objects of the present invention can be accomplished by a high-frequency module comprising a main module including a first high-frequency circuit at least a part of which is constituted by a conductive pattern built in a multi-layered substrate and a sub-module including a second high-frequency circuit, the sub-module being inserted into a cavity formed in the main module.

According to the present invention, the main module including the first high-frequency circuit and the sub-module including the second high-frequency circuit are constituted as separate components and the main module and the sub-module are integrated by inserting the sub-module into the cavity formed in the main module. Therefore, it is possible to use only a main module and sub-module that have been inspected after manufacture and found to be non-defective. Accordingly, it is possible to markedly increase the yield of the high-frequency module as a whole. Further, according to the present invention, since the main module and the sub-module are constituted as separate components, when, for example, characteristics of the second high-frequency circuit included in the sub-module need to be changed for example, it is sufficient to redesign only the sub-module without redesigning the main module and, therefore, the general utility of the high-frequency module can be improved.

In a preferred aspect of the present invention, the first high-frequency circuit is constituted by the conductive pattern built in the multi-layered substrate and electronic components mounted on the multi-layered substrate.

In a further preferred aspect of the present invention, the sub-module is constituted using a multi-layered substrate.

In a further preferred aspect of the present invention, the multi-layered substrate of the main module and the multi-layered substrate of the sub-module are made of different materials.

In a further preferred aspect of the present invention, the multi-layered substrate of the main module is constituted as a laminate including a plurality of resin substrates.

In a further preferred aspect of the present invention, the multi-layered substrate of the sub-module is constituted as a laminate including a plurality of ceramic substrates.

In a further preferred aspect of the present invention, a plurality of electrodes provided on a bottom surface of the cavity of the main module and a plurality of electrodes provided on a bottom surface of the sub-module are electrically connected.

In a further preferred aspect of the present invention, the plurality of electrodes provided on the bottom surface of the cavity of the main module and the plurality of electrodes provided on the bottom surface of the sub-module are electrically connected by solder.

In a further preferred aspect of the present invention, the plurality of electrodes provided on the bottom surface of the cavity of the main module and the plurality of electrodes provided on the bottom surface of the sub-module are electrically connected via an anisotropic conductive sheet.

In a further preferred aspect of the present invention, an upper portion of the cavity into which the sub-module is inserted is covered by a metal plate.

In a further preferred aspect of the present invention, the metal plate is connected to a ground pattern formed on an upper surface of the main module.

In a further preferred aspect of the present invention, an impedance matching section is further built in the multi-layered substrate of the main module for matching impedance of the first high-frequency circuit and that of the second high-frequency circuit.

In a further preferred aspect of the present invention, the first high-frequency circuit is constituted as at least one circuit selected from the group consisting of a front-end module section, a power amplifier module section, a synthesizer module section, an LSI section and a SAW filter module section.

In a further preferred aspect of the present invention, the second high-frequency circuit is constituted as at least one circuit selected from the group consisting of a front-end module section, a power amplifier module section, a synthesizer module section, an LSI section and a SAW filter module section and other than the circuit constituting the first high-frequency circuit.

The above and other objects of the present invention can be also accomplished by a high-frequency module comprising a first cavity and a second cavity constituted so that a first sub-module and a second sub-module can be inserted therein, prescribed high-frequency circuits integrated therewith and an impedance matching circuit built therein for matching impedance of the first sub-module and that of the second sub-module.

According to this aspect of the present invention, since the first sub-module and second sub-module can be inserted into the first cavity and second cavity, it is possible to use only sub-modules inspected after manufacture and found to be non-defective. Accordingly, it is possible to markedly increase the yield of the high-frequency module as a whole. Further, according to this aspect of the present invention, when characteristics of the circuit included in either of the sub-modules needs to be changed, it is sufficient to redesign only the sub-module whose circuit is to be changed and, therefore, the general utility of the high-frequency module can be improved. Furthermore, since the impedance matching circuit for matching impedance of the first sub-module and that of the second sub-module is built in the high-frequency module, it is unnecessary to add a separate impedance matching circuit to the high-frequency module and, therefore, the overall size of the high-frequency module can be reduced.

In a preferred aspect of the present invention, an impedance matching circuit is further built in the high-frequency module for matching impedance of the high-frequency circuit and that of the first sub-module.

BRIEF DESCRIPTION OF THE DRAWINGS

FIG. 2 shows the structure of a main module constituting a high-frequency module which is a preferred embodiment of the present invention, wherein FIG. 2(a) is a plan view thereof, FIG. 2(b) is a cross sectional view taken along a line a–b in FIG. 2(a) and FIG. 2(c) is a cross sectional view taken along a line c–d in FIG. 2(a).

FIG. 8 shows the structure of a high-frequency module fabricated by inserting a first sub-module, a second sub-module, a semiconductor chip package and a third sub-module into first to fourth cavities formed in a main module, wherein FIG. 8(a) is a plan view of thereof and FIG. 8(b) is a cross sectional view taken along a line a–b in FIG. 8(a).

FIG. 9 shows the structure of a high-frequency module which is another embodiment of the present invention, wherein FIG. 9(a) is a plan view thereof and FIG. 9(b) is a cross sectional view taken along a line e–f in FIG. 9(a).

DESCRIPTION OF THE PREFERRED EMBODIMENT

A preferred embodiment of the present invention will now be described in detail with reference to accompanying drawings.

Figure 1:
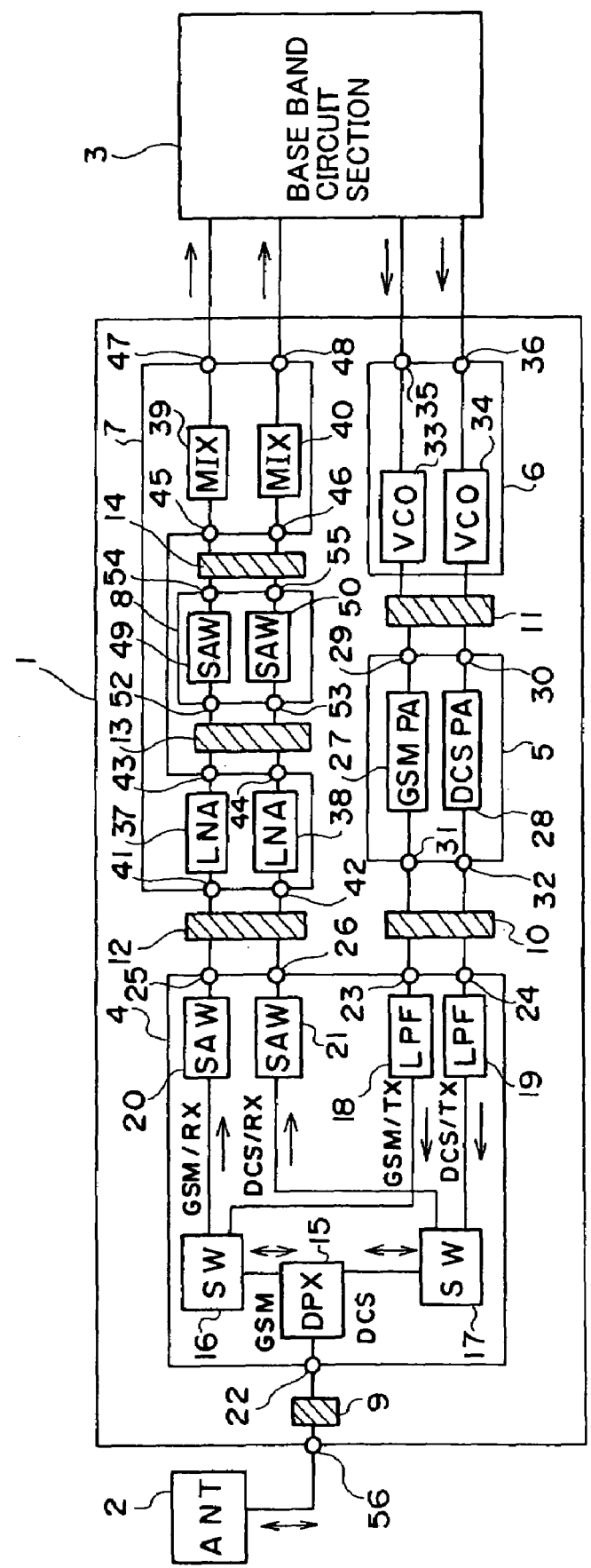
FIG. 1 is a block diagram schematically showing the circuit configuration of a high-frequency module which is a preferred embodiment of the present invention.

FIG. 1 is a block diagram schematically showing the circuit configuration of a high-frequency module 1 which is a preferred embodiment of the present invention. The high-frequency module 1 according to this embodiment is adapted to be incorporated into a dual-band cellular phone by which communication can be performed by two systems, although it is not limited to such use. The two systems are the GSM system and the DCS system, for example. These are cellular phone systems employed in Europe. In the GSM system, the receiving frequency is from 925 to 960 MHz and the transmitting frequency is from 880 to 915 MHz. In the DCS system, the receiving frequency is from 1805 to 1880 MHz and the transmitting frequency is from 1710 to 1785 MHz.

As shown in FIG. 1, the high-frequency module 1 according to this embodiment is disposed between an antenna 2 and a base band section 3 of the dual-band type cellular phone and serves to feed a received signal from the antenna 2 to the base band section 3 and feed out a transmitting signal fed from the base band section 3 to the antenna 2.

More specifically, the high-frequency module 1 includes a front-end module section 4, a power amplifier module section 5, a synthesizer module section 6, an LSI section 7, a SAW (Surface Acoustic Wave) filter module section 8 and impedance matching sections 9 to 14.

The front-end module section 4 includes a diplexer (DPX) 15 for separating signals whose frequencies are within the frequency band used in the GSM system and signals whose frequencies are within the frequency band used in the DCS system, a high-frequency switch (SW) 16 for switching between transmitted and received signals on the GSM system side, a high-frequency switch (SW) 17 for switching between transmitted and received signals on the DCS system side, low-pass filters (LPF) 18, 19 connected to node points of the high-frequency switches 16, 17 on the respective signal transmission sides, and SAW filters (SAW) 20, 21 connected to node points of the high-frequency switches 16, 17 on the respective signal reception sides. As explained later in detail, the diplexer 15, the high-frequency switches 16, 17, the low-pass filters 18, 19 and the SAW filters 20, 21 are integrated as a single module.

The front-end module section 4 further includes an antenna terminal 22, a GSM-side signal transmitting terminal 23, a DCS-side signal transmitting terminal 24, a GSM-side signal receiving terminal 25 and a DCS-side signal receiving terminal 26 as external terminals. The antenna terminal 22 is connected to an antenna node point of the diplexer 15. The GSM-side signal transmitting terminal 23 is connected to the low-pass filter 18 and the DCS-side signal transmitting terminal 24 is connected to the low-pass filter 19. The GSM-side signal receiving terminal 25 is connected to the SAW filter 20 and the DCS-side signal receiving terminal 26 is connected to the SAW filter 21.

The power amplifier module section 5 includes a GSM-side power amplifier (GMSPA) 27 for amplifying transmitted signals on the GMS system side and a DCS-side power amplifier (DCSPA) 28 for amplifying transmitted signals on the DCS system side and as explained later in detail, the GSM-side power amplifier 27 and the DCS-side power amplifier 28 are integrated. The power amplifier module section 5 further includes as external terminals, input terminals 29, 30 to which input signals to the GSM-side power amplifier 27 and the DCS-side power amplifier 28 are fed and output terminals 31, 32 to which output signals from the GSM-side power amplifier 27 and the DCS-side power amplifier 28 are fed.

The synthesizer module section 6 includes a voltage-controlled oscillator (VCO) 33 for modulating audio signals in the GSM system and the like and a voltage-controlled oscillator (VCO) 34 for modulating audio signals and the like in the DCS system and, as explained later in detail, the voltage-controlled oscillator 33 and the voltage-controlled oscillator 34 are built in the main module. The synthesizer module section 6 further includes, as external terminals, input terminals 35, 36 to which input signals to the voltage-controlled oscillator 33 and the voltage-controlled oscillator 34 are fed. As shown in FIG. 1, the input terminals 35, 36 are connected to the base band circuit section 3.

The LSI section 7 includes a GSM-side low-noise amplifier (LNA) 37 for amplifying received signals on the GSM system side, a DCS-side low-noise amplifier (LNA) 38 for amplifying received signals on the DCS system side, a GSM-side mixer (MIX) 39 for synthesizing an intermediate frequency signal based on the received signal on the GSM system side and a DCS-side mixer (MIX) 40 for synthesizing an intermediate frequency signal based on the received signal on the DCS system side. As explained later in detail, these are integrated in a single semiconductor chip. The LSI section 7 further includes, as external terminals, input terminals 41, 42 to which input signals to the GSM-side low-noise amplifier 37 and the DCS-side low-noise amplifier 38 are fed, output terminals 43, 44 to which output signals from the GSM-side low-noise amplifier 37 and the DCS-side low-noise amplifier 38 are fed, input terminals 45, 46 to which input signals to the GSM-side mixer 39 and the DCS-side mixer 40 are fed, and output terminals 47, 48 to which output signals from the GSM-side mixer 39 and the DCS-side mixer 40 are fed. As shown in FIG. 1, the output terminals 47, 48 are connected to the base band circuit section 3.

The SAW filter module section 8 includes a GSM-side SAW filter (SAW) 49 for extracting from among signals received on the GSM system side those that are in the desired frequency band (925 to 960 MHz), and a DCS-side SAW filter (SAW) 50 for extracting from among signals received on the DCS system side those that are in the desired frequency band (1805 to 1880 MHz) As explained later in detail, the GSM-side SAW filter 49 and the DCS-side SAW filter 50 are integrated as a single sub-module. The SAW filter module section 8 further includes, as external terminals, input terminals 52, 53 to which input signals to the GSM-side SAW filter 49 and the DCS-side SAW filter 50 are fed, and output terminals 54, 55 to which output signals from the GSM-side SAW filter 49 and the DCS-side SAW filter 50 are fed.

The output terminals mentioned in connection with the front-end module section 4, the power amplifier module section 5, the synthesizer module section 6, the LSI section 7 and the SAW filter module section 8 are only primary output terminals included therein and other external terminals such as a power source terminal, various control terminals such as a control terminal for controlling the switching operation of the high-frequency switch 16 and the like are provided in addition to the above mentioned output terminals.

Further, the high-frequency module 1 includes an antenna terminal 56 connected to the antenna 2 and the impedance matching section 9 is connected to a point between the antenna terminal 56 and the antenna terminal 22 of the front-end module section 4 and serves to match the impedance of the antenna 2 and that of the front-end module section 4.

Similarly, the impedance matching section 10 is connected to a point between the GMS-side signal transmitting terminal 23 and the DCS-side signal transmitting terminal 24 of the front-end module section 4 and the output terminals 31, 32 of the power amplifier module section 5 and serves to match the impedance of the front-end module section 4 and that of the power amplifier module section 5. The impedance matching section 11 is connected to a point between the input terminals 29, 30 of the power amplifier module section 5 and an output node point of the voltage-controlled oscillators 33, 34 of the synthesizer module section 6 and serves to match the impedance of the power amplifier module section 5 and that of the synthesizer module section 6. The impedance matching section 12 is connected to a point between the GMS-side signal receiving terminal 25 and the DCS-side signal receiving terminal 26 of the front-end module section 4 and the input terminals 41, 42 of the LSI section 7 and serves to match the impedance of the front-end module section 4 and that of the LSI section 7. The impedance matching section 13 is connected to a point between the output terminals 33, 34 of the LSI section 7 and the input terminals 52, 53 of the SAW filter module section 8 and serves to match the impedance of the LSI section 7 and that of the SAW filter module section 8. The impedance matching section 14 is connected to a point between the input terminals 45, 46 of the LSI section 7 and the output terminals 54, 55 of the SAW filter module section 8 and serves to match the impedance of the LSI section 7 and that of the SAW filter module section 8.

Next, explanation will be made regarding the concrete structure of the high-frequency module 1 according to this embodiment.

Figure 2:
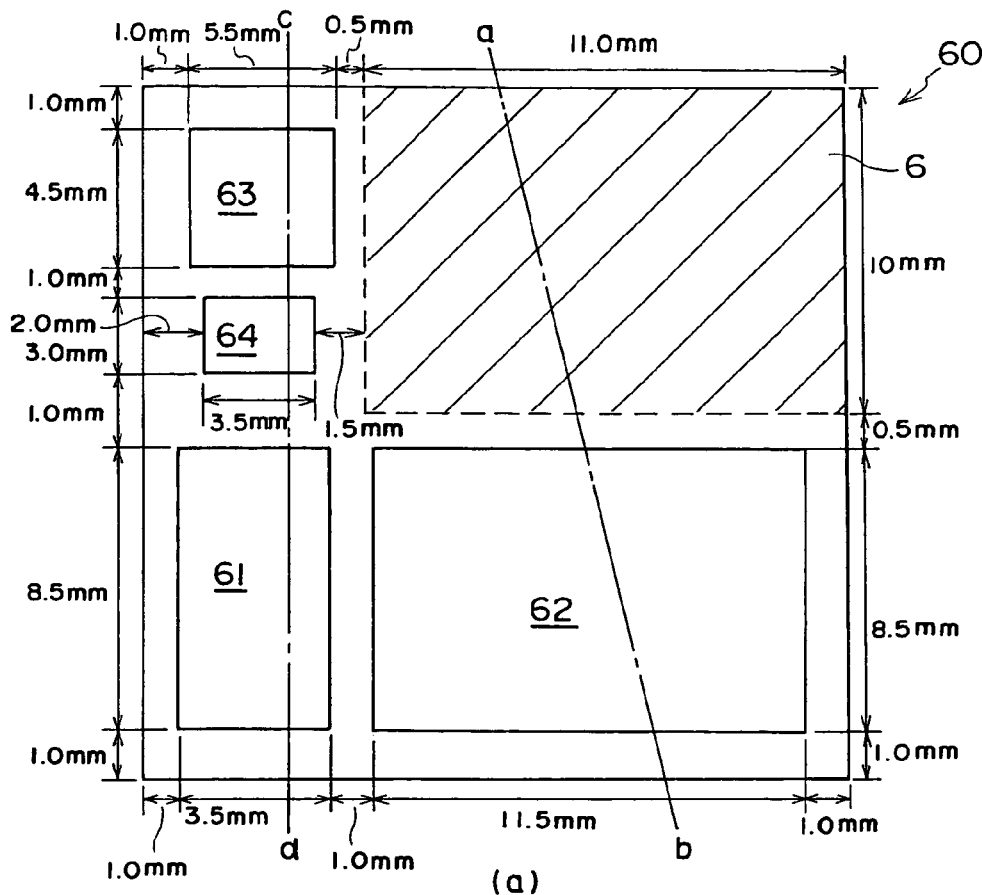
Figure 2:
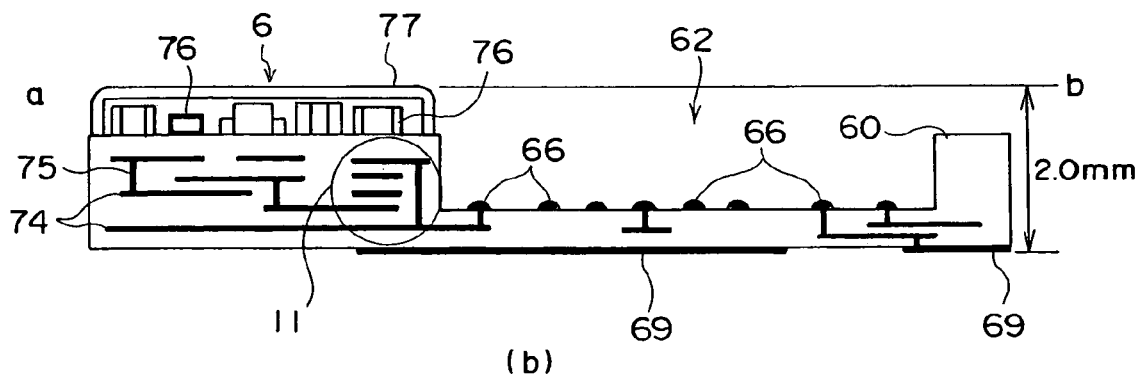
Figure 2:
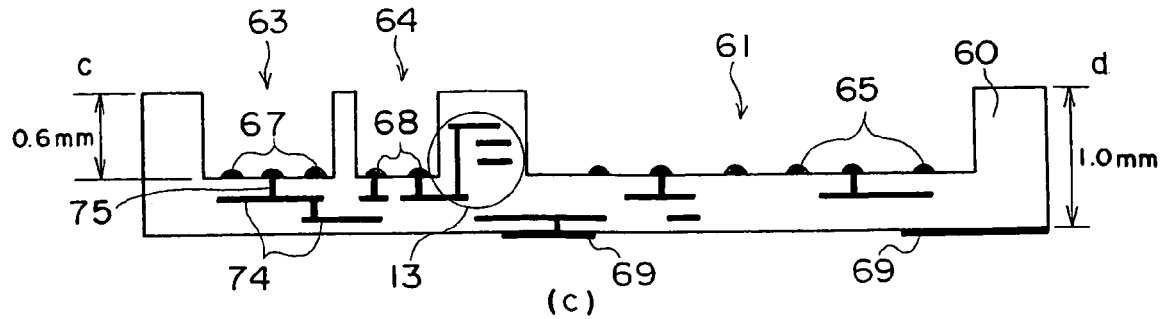

FIG. 2 shows the structure of a main module 60 constituting the high-frequency module 1 according to this embodiment, wherein FIG. 2(a) is a plan view thereof, FIG. 2(b) is a cross sectional view taken along a line a–b in FIG. 2(a) and FIG. 2(c) is a cross sectional view taken along a line c–d in FIG. 2(a).

As shown in FIGS. 2(a) to 2(c), the main module 60 constituting the high-frequency module 1 according to this embodiment has a rectangular footprint measuring about 18 mm×about 20 mm and a thickness of about 2.0 mm. The main module 60 is consists of a multi-layered substrate constituted by laminating a plurality of resin substrates and formed with prescribed elements such as inductors and the like, a conductive pattern 74 constituting wiring and a through-hole electrode 75, and various electronic components 76 such as diodes mounted on the multi-layered substrate. As shown in FIGS. 2(b) and 2(c), a part of the main module 60 measuring about 11 mm×about 10 mm constitutes the synthesizer module section 6. The remainder of the main module 60 other than the synthesizer module section 6 is formed with first to fourth cavities 61 to 64. A metal cap 77 is provided on the upper surface of the portion of the main module 60 constituting the synthesizer module section for blocking electromagnetic waves.

The first cavity 61 is a cavity into which a sub-module constituting the front-end module section 4 is inserted and has a footprint measuring 3.5 mm×8.5 mm and a depth of 0.6 mm. The second cavity 62 is a cavity into which a sub-module constituting the power amplifier module section 5 is inserted and has a footprint measuring 11.5 mm×8.5 mm and a depth of 0.6 mm. The third cavity 63 is a cavity into which a semiconductor chip package constituting the LSI section 7 is inserted and has a footprint measuring 5.5 mm×4.5 mm and a depth of 0.6 mm. The fourth cavity 64 is a cavity into which a sub-module constituting the SAW filter module section 8 is inserted and has a footprint measuring 3.5 mm×3.0 mm and a depth of 0.6 mm.

As shown in FIG. 2(c), a plurality of solder bumps 65 are provided on the bottom surface of the first cavity 61 and when the sub-module constituting the front-end module section 4 is inserted into the first cavity 61, the external terminals of the sub-module such as the antenna terminal 22, the GSM-side signal transmitting terminal 23, the DCS-side signal transmitting terminal 24, the GSM-side signal receiving terminal 25, the DCS-side signal receiving terminal 26 and the like are electrically connected to the solder bumps 65.

Similarly, as shown in FIG. 2(b), a plurality of solder bumps 66 are provided on the bottom surface of the second cavity 62 and when the sub-module constituting the power amplifier module section 5 is inserted into the second cavity 62, the external terminals of the sub-module such as the input terminals 29, 30, the output terminals 31, 32 and the like are electrically connected to the solder bumps 66.

Similarly, as shown in FIG. 2(c), a plurality of solder bumps 67 are provided on the bottom surface of the third cavity 63 and when the semiconductor chip package constituting the LSI section 7 is inserted into the third cavity 63, the external terminals of the semiconductor chip package such as the input terminals 41, 42, 45, 46, the output terminals 43, 44, 47, 48 and the like are electrically connected to the solder bumps 67.

Similarly, as shown in FIG. 2(c), a plurality of solder bumps 68 are provided on the bottom surface of the fourth cavity 64 and when the sub-module constituting the SAW filter module section 8 is inserted into the fourth cavity 64, the external terminals of the sub-module such as the input terminals 52, 53, the output terminals 54, 55 and the like are electrically connected to the solder bumps 68.

Further, the rear surface of the main module 60 is formed with a plurality of external terminals 69 such as the antenna terminal 56 and the like and when the main module 60 is mounted on a mother board (not shown), the external terminals 69 are electrically connected to terminals provided on the mother board.

Furthermore, as shown in FIGS. 2(b) and 2(c), the impedance matching sections 9 to 14 formed using conductive patterns 74 are built in the main module 60 in addition to the synthesizer module section 6. In FIGS. 2(b) and 2(c), only the impedance matching sections 11 and 13 are shown.

Figure 3:
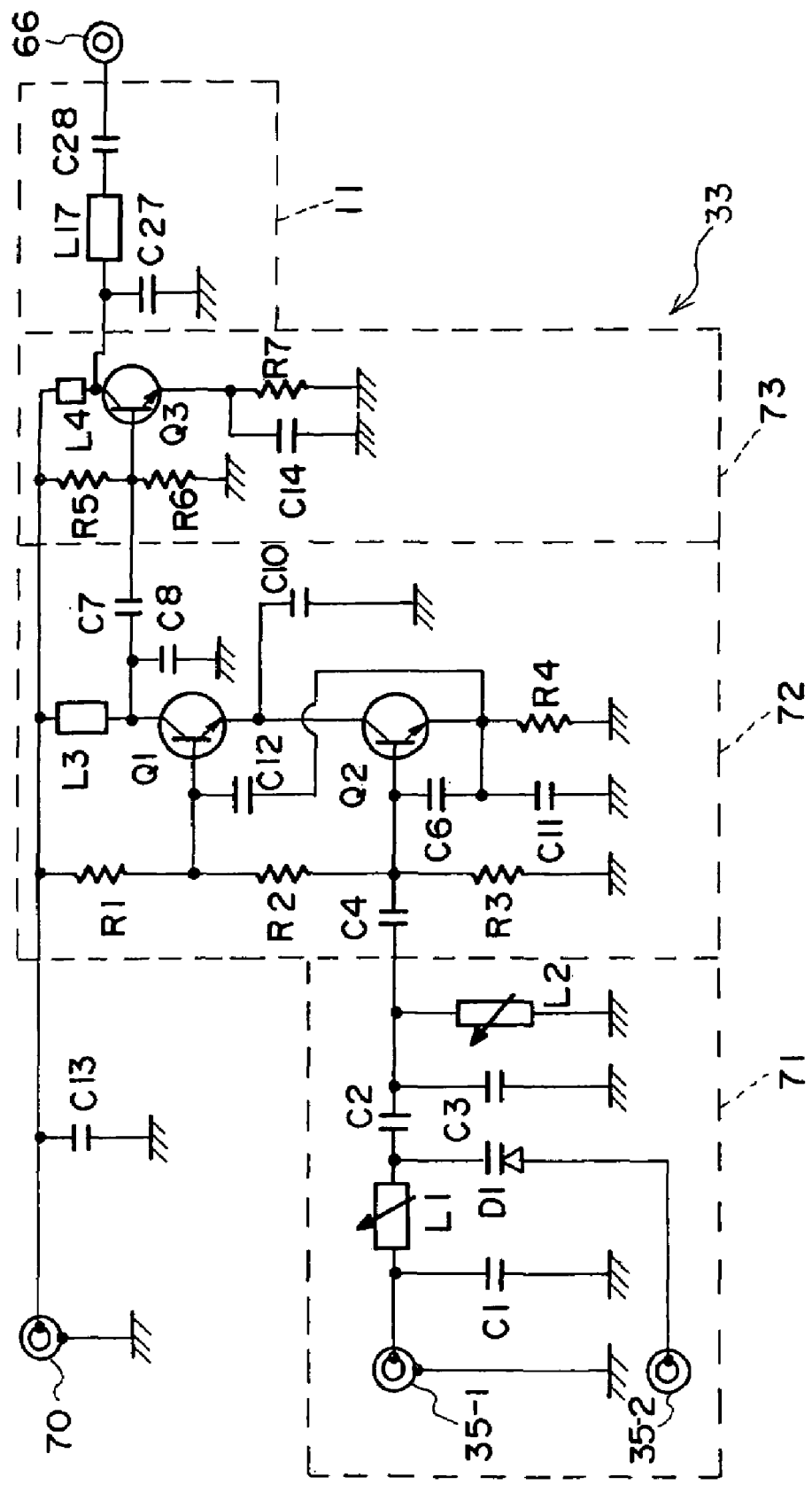
FIG. 3 is a circuit diagram showing one example of a circuit configuration of a voltage-controlled oscillator and part of an impedance matching section constituting a synthesizer module section.

FIG. 3 is a circuit diagram showing one example of the circuit configuration of the voltage-controlled oscillator 33 and a part of the impedance matching section 11 constituting the synthesizer module section 6.

As shown in FIG. 3, the voltage-controlled oscillator 33 includes a voltage variable resonant circuit 71, an oscillation circuit 72 and an output amplifying circuit 73. A control voltage and modulation signal are fed to the voltage variable resonant circuit 71 from the base band circuit section 3 via the input terminals 35 (35-1 and 35-2), and the oscillation circuit 72 and the output amplifying circuit 73 generate a modulation signal as output based on an output signal supplied from the voltage variable resonant circuit 71 and power-supply voltage supplied from the power supply terminal 70. The output of the output amplifying circuit 73 is fed to the impedance matching section 11 and the output of the impedance matching section 11 is fed to the solder bumps 66. As described above, since the solder bumps 66 are electrodes formed on the bottom surface of the second cavity 62, the external terminals (input terminals) of the sub-module constituting the power amplifier module 5 are electrically connected to the solder bumps 66 when the sub-module is inserted into the second cavity 62.

Figure 4:
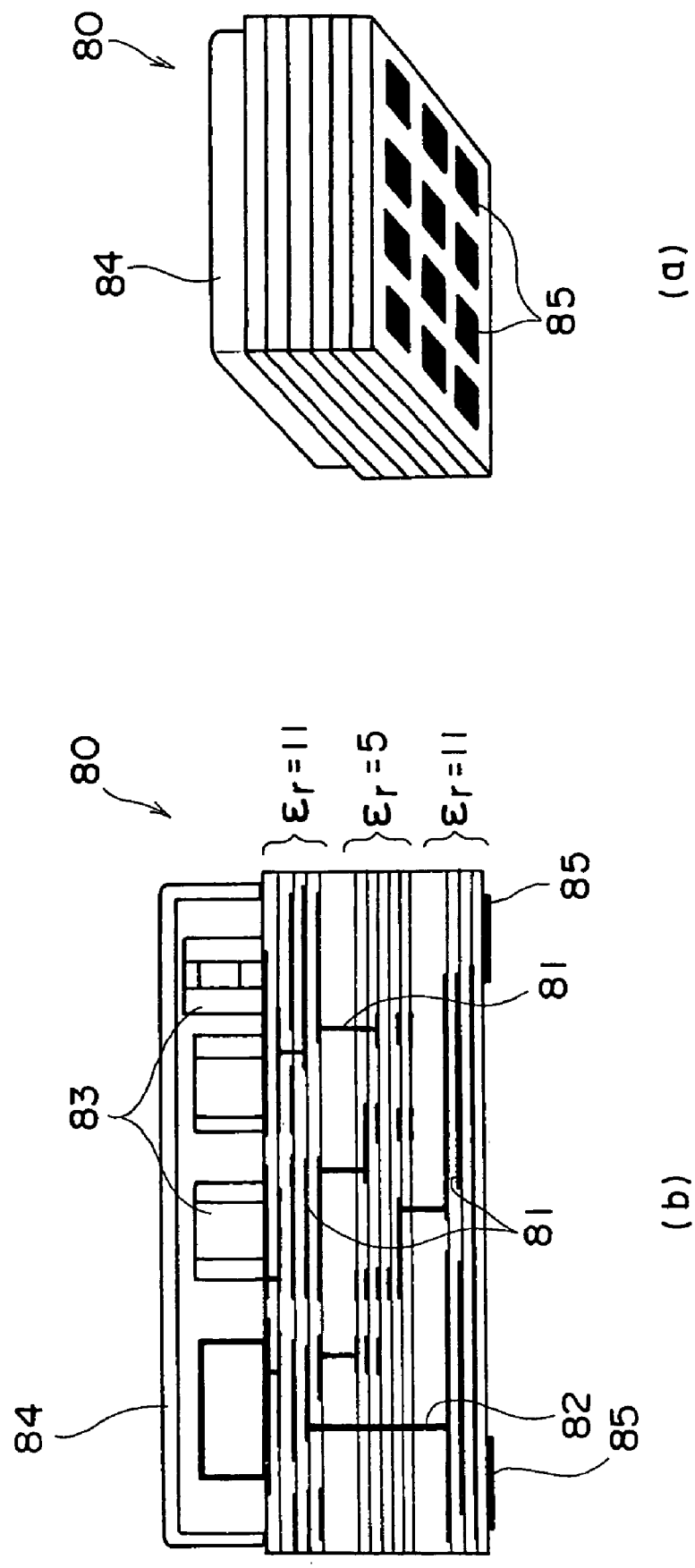
FIG. 4(a) is a schematic perspective view showing the rear surface of a sub-module for constituting a front-end module section and FIG. 4(b) is a cross sectional view thereof.

The voltage-controlled oscillator 34 constituting the synthesizer module section 6 has the same circuit configuration as that of the voltage-controlled oscillator 33 shown in FIG. 4 and the output thereof is fed to the impedance matching section 11 similarly to that of the voltage-controlled oscillator 33.

As shown in FIGS. 2(a) and 2(b), a part of the voltage-controlled oscillator 33 and the voltage-controlled oscillator 34 having such circuit configurations are constituted as conductive patterns provided inside of the main module 60 and remaining portions thereof are constituted as electronic components mounted on the upper surface of the main module 60. As a result, the synthesizer module section 6 and the impedance matching sections 9 to 11 are integrated with the main module 60 and other sections such as the front-end module section 4 and the like are constituted so as to be insertable into the main module 60.

In this manner, since only the synthesizer module section 6 and the impedance matching sections 9 to 11 are integrated with the main module 60, the production yield of the main module 60 becomes the same as that of the synthesizer module section 6.

FIG. 4(a) is a schematic perspective view showing the rear surface of a sub-module for constituting the front-end module section 4 and FIG. 4(b) is a cross sectional view thereof.

As shown in FIGS. 4(a) and 4(b), the sub-module 80 constituting the front-end module section 4 has a rectangular footprint measuring about 3.0 mm×about 8.0 mm and a thickness of about 1.5 mm. The sub-module 80 is consists of a multi-layered substrate constituted of a plurality of laminated ceramic substrates and formed with conductive patterns 81 and a through-hole electrode 82 that form prescribed elements and wiring therein, and various electronic components 83 mounted on the multi-layered substrate. A metal cap 84 for blocking electromagnetic waves is provided on the upper surface of the multi-layered substrate.

As shown in FIG. 4(a), the ceramic substrates constituting the sub-module 80 include two kinds of ceramic substrates having different dielectric constants. The ceramic substrates having a high dielectric constant $\in r$, for example, $\in r=11$, are disposed at an upper layer portion and a lower layer portion, and conductive patterns 81 on these ceramic substrates mainly constitute capacitor electrodes. On the other hand, the ceramic substrates having a low dielectric constant ∈r, for example, ∈r=5, are disposed at an intermediate layer portion and conductive patterns 81 on these ceramic substrates mainly constitute inductor electrodes.

On the rear surface of the sub-module 80, a plurality of external electrodes 85 are provided so as to constitute the antenna terminal 22, the GSM-side signal transmitting terminal 23, the DCS-side signal transmitting terminal 24, the GSM-side signal receiving terminal 25, the DCS-side signal receiving terminal 26 and the like, and the planar configuration of the external electrodes 85 corresponds to that of the solder bumps 65 provided on the bottom surface of the first cavity 61. Therefore, as described above, when the sub-module 80 is inserted into the first cavity 61, these external electrodes 85 and the solder bumps 65 are electrically connected.

The sub-module 80 for constituting the front-end module section 4 is designed and manufactured independently of the main module 60 and is inspected independently of the main module 60 before being inserted into the first cavity 61. Therefore, the yield of the sub-module 80 is substantially independent of that of the main module 60.

Figure 5:
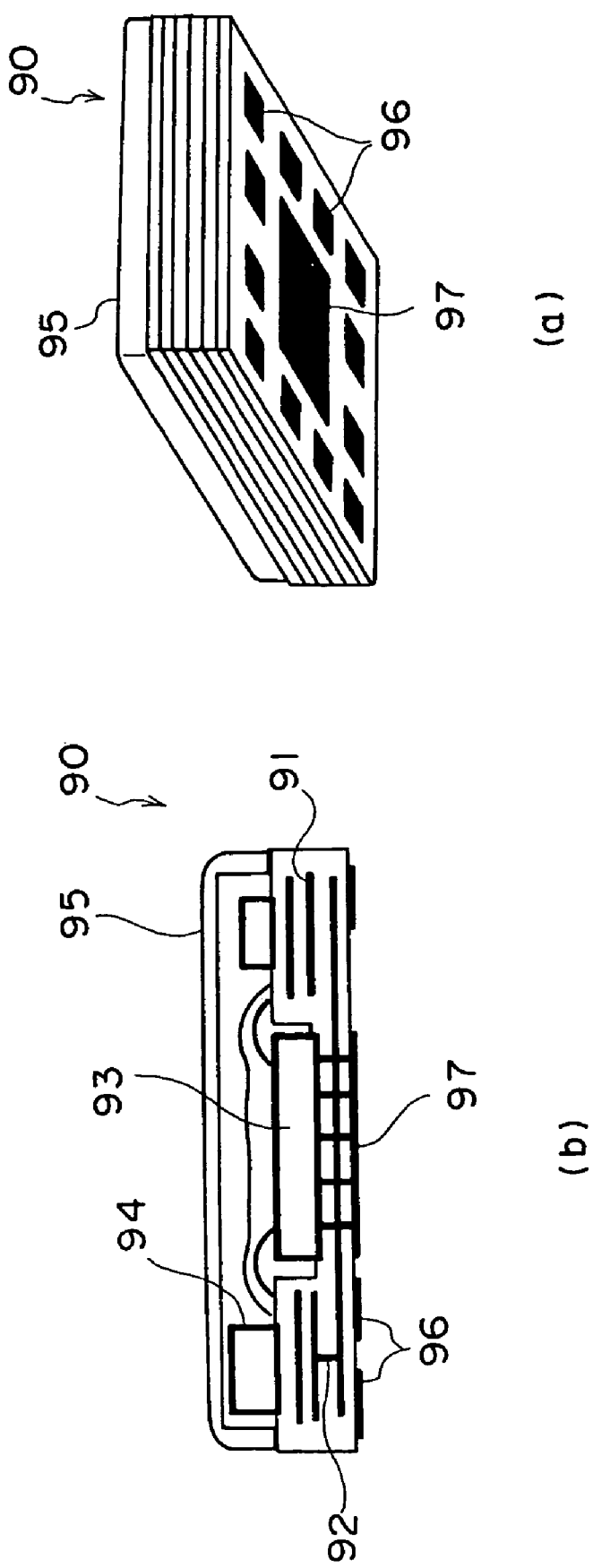
FIG. 5(a) is a schematic perspective view showing the rear surface of a sub-module for constituting a power amplifier module section and FIG. 5(b) is a cross sectional view thereof.

FIG. 5(*a*) is a schematic perspective view showing the rear surface of a sub-module for constituting the power amplifier module section 5 and FIG. 5(*b*) is a cross sectional view thereof.

As shown in FIGS. 5(*a*) and 5(*b*), the sub-module 90 constituting the power amplifier module section 5 has a rectangular footprint measuring about 11.0 mm×about 8.0 mm and a thickness of about 1.5 mm. The sub-module 90 consists of a multi-layered substrate constituted of a plurality of laminated resin substrates and formed with conductive patterns 91 and a through-hole electrode 92 forming predetermined elements and wiring therein, a semiconductor chip (MMIC) 93 embedded in the multi-layered substrate, and various electronic components 94 mounted on the multi-layered substrate. A metal cap 95 for blocking electromagnetic waves is provided on the upper surface of the multi-layered substrate. As the resin substrates for constituting the sub-module 90, the same kind of the resin substrates as those for constituting the main module 60 may be used or different kind of resin substrates or resin substrates having different dielectric constants from those for constituting the main module 60 may be used.

Further, the rear surface of the sub-module 90 is formed with a plurality of external electrodes 96 for constituting the input terminals 29, 30, the output terminals 31, 32 and the like and a radiator electrode 97 for radiating heat generated by the semiconductor chip 93. The planar configuration of the external electrodes 96 corresponds to that of the solder bumps 66 provided on the bottom surface of the second cavity 62. Therefore, as described above, when the sub-module 90 is inserted into the second cavity 62, these external electrodes 96 and the solder bumps 66 are electrically connected.

The sub-module 90 for constituting the power amplifier module section 5 is designed and manufactured independently of the main module 60 and is inspected independently of the main module 60 before being inserted into the second cavity 62. Therefore, the yield of the sub-module 90 is substantially independent of that of the main module 60.

Figure 6:
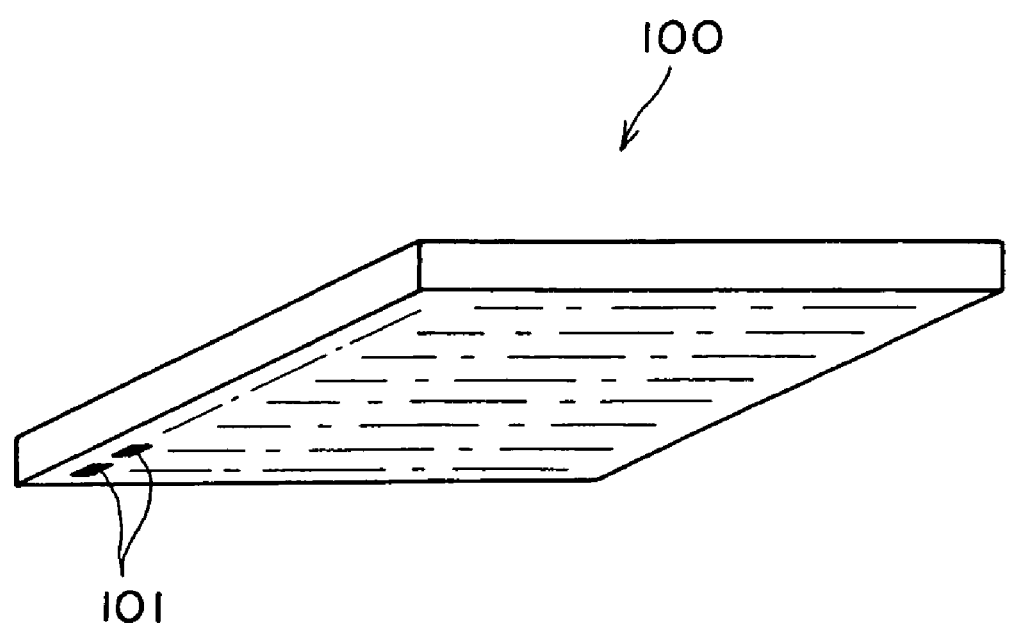
FIG. 6 is a schematic perspective view showing the rear surface of a semiconductor chip package for constituting an LSI section.

FIG. 6 is a schematic perspective view showing the rear surface of a semiconductor chip package for constituting the LSI section 7.

As shown in FIG. 6, the semiconductor chip package 100 constituting the LSI section 7 has a rectangular footprint measuring about 5.0 mm×about 4.0 mm and a thickness of about 5.0 mm. The semiconductor chip package 100 is a package obtained by plastic molding a semiconductor chip that integrates circuits for accomplishing the functions of the DSM-side low noise amplifier 37, the DCS-side low noise amplifier 38, the DSM-side mixer 39, the DCS-side mixer 40 and the like. A plurality of external electrodes 101 are provided array-like on the rear surface of the semiconductor chip package 100 so as to constitute the input terminals 41, 42, 45, 46, the output terminals 43, 44, 47, 48 and the like. The planar configuration of the external electrodes 101 corresponds to that of the solder bumps 67 provided on the bottom surface of the third cavity 63. Therefore, as described above, when the semiconductor chip package 100 is inserted into the third cavity 63, these external electrodes 101 and the solder bumps 67 are electrically connected.

Similarly to the sub-modules 80 and 90, the semiconductor chip package 100 for constituting the LSI section 7 is designed and manufactured independently of the main module 60 and is inspected independently of the main module 60 before being inserted into the third cavity 63. Therefore, the yield of the semiconductor chip package 100 is substantially independent of those of the main module 60 and the sub-modules 80 and 90. In this specification, the semiconductor chip package 100 is sometimes called a "sub-module" and this term is used to conceptually include the semiconductor chip package 100.

Figure 7:
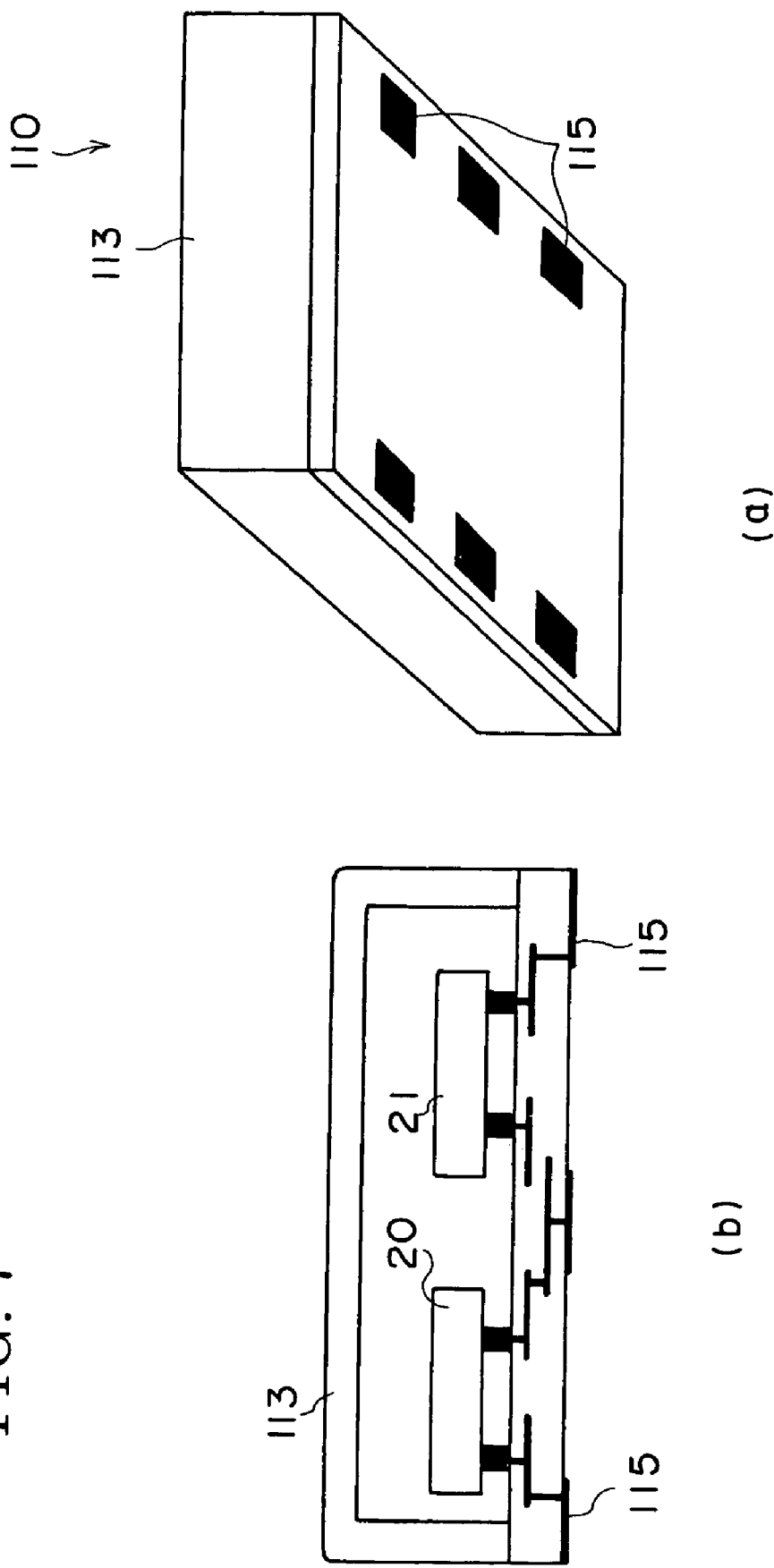
FIG. 7(a) is a schematic perspective view showing the rear surface of a sub-module for constituting a SAW filter module section and FIG. 7(b) is a cross sectional view thereof.

FIG. 7(*a*) is a schematic perspective view showing the rear surface of a sub-module for constituting the SAW filter module section 8 and FIG. 7(*b*) is a cross sectional view thereof.

As shown in FIGS. 7(*a*) and 7(*b*), the sub-module 110 constituting the SAW filter module section 7 has a rectangular footprint measuring about 3.0 mm×about 2.5 mm and a thickness of about 1.0 mm. The sub-module 110 consists of a multi-layered ceramic base formed with conductive patterns 111 and a through-hole electrode 112 therein, the SAW filters 20, 21, and a sealing cap 113. The SAW filters 20, 21 are air-tightly sealed by the sealing cap 113.

A plurality of external electrodes 115 are provided on the rear surface of the sub-module 110 for constituting the input terminals 52, 53, the output terminals 54, 55 and the like, and the planar configuration of the external electrodes 115 correspond to that of the solder bumps 68 provided on the bottom surface of the fourth cavity 64. Therefore, as described above, when the sub-module 110 is inserted into the fourth cavity 64, these external electrodes 115 and the solder bumps 68 are electrically connected.

Similarly to the sub-modules 80, 90 and the semiconductor chip package 100, the sub-module 110 for constituting the SAW filter module section 8 is designed and manufactured independently of the main module 60 and is inspected independently of the main module 60 before being inserted into the fourth cavity 64. Therefore, the yield of the sub-module 110 is substantially independent of those of the main module 60, the sub-modules 80, 90 and the semiconductor chip package 100.

The high-frequency module 1 is completed by inserting the sub-module 80, the sub-module 90, the semiconductor chip package 100 and the sub-module 110 into the first to fourth cavities 61 to 64 and establishing electrical connection. The sub-module 80, the sub-module 90, the sub-module 110 and the semiconductor chip package 100 can be easily handled by grasping the metal caps 84, 95 and 115 provided at the upper portions of the sub-module 80, the sub-module 90 and the sub-module 110 and the surface of the semiconductor chip package 100. After sub-modules have been inserted, the solder bumps 65 to 68 provided on the bottom surfaces of the first to fourth cavity 61 to 64 are once melted by reflow soldering, whereby the electrical and mechanical connection between the solder bumps 65 to 68 and the corresponding external electrodes 85, 96, 101, 115 is established.

Figure 8:
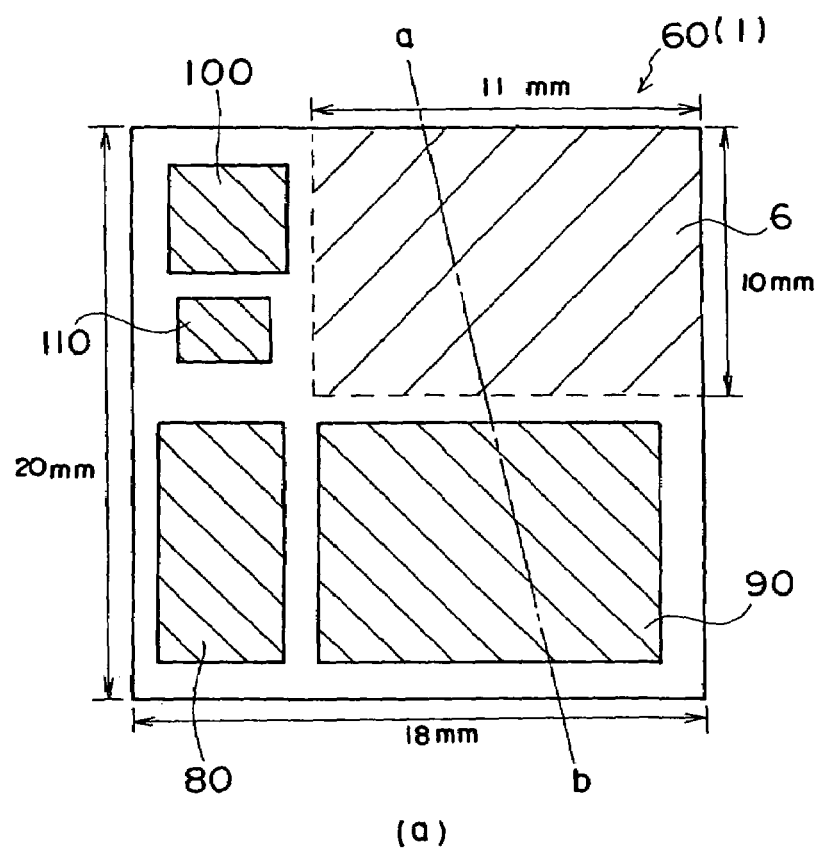
Figure 8:
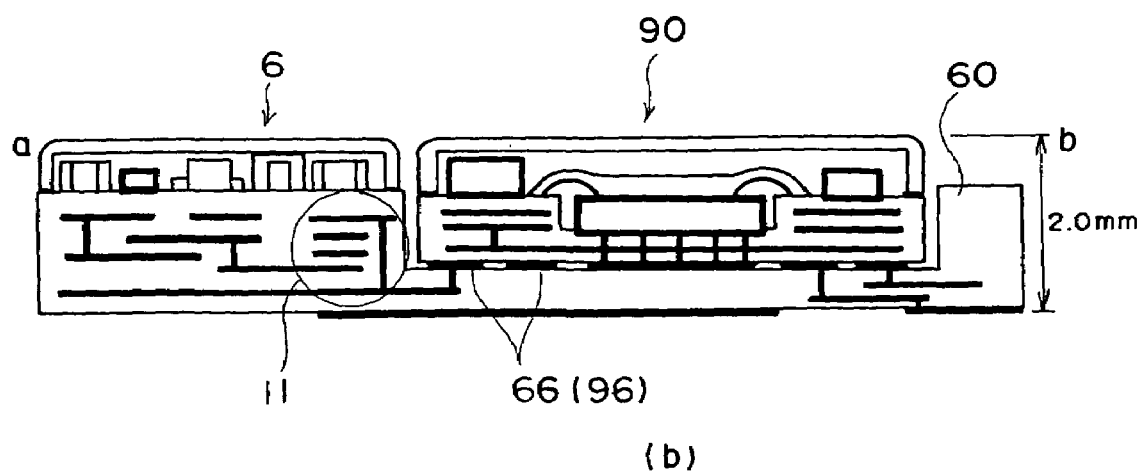

FIG. 8 shows the structure of the high-frequency module 1 fabricated by inserting the sub-module 80, the sub-module 90, the semiconductor chip package 100 and the sub-module 110 into the first to fourth cavities 61 to 64 formed in the main module 60, wherein FIG. 8(a) is a plan view of the high-frequency module 1 and FIG. 8(b) is a cross sectional view taken along a line a–b in FIG. 8(a).

As shown in FIG. 8, when the sub-module 80, the sub-module 90, the semiconductor chip package 100 and the sub-module 110 have been inserted into the first to fourth cavities 61 to 64 and the electrical and mechanical connection has been established, the main module 60 can be handled as a large scale module having all functions of the high-frequency module 1 shown in FIG. 1.

Thus, although the high-frequency module 1 according to the above described embodiment is a large scale module including the front-end module section 4, the power amplifier module section 5, the synthesizer module section 6, the LSI section 7, the SAW filter module section 8 and the impedance matching sections 11 to 14, only some of the circuits, namely, only the synthesizer module section 6 and the impedance matching sections 11 to 14 are integrated with or built in the main module 60 as the main body and the remaining circuits, namely, the front-end module section 4, the power amplifier module section 5, the LSI section 7 and the SAW filter module section 8 are inserted into the main module 60 as sub-modules. Therefore, since the high-frequency module 1 can be fabricated using only sub-modules inspected after manufacture and found to be good, the production yield of the high-frequency module 1 can be markedly increased.

Further, in the high-frequency module 1 according to the above described embodiment, since the sub-module 80, the sub-module 90, the main module 60, the semiconductor chip package 100 and the sub-module 110 constituting the front-end module section 4, the power amplifier module section 5, the synthesizer module section 6, the LSI section 7 and the SAW filter module section 8 are separate components, it is possible when the characteristics of some of these circuits needs to be changed to implement the required changes by redesigning only the corresponding sub-modules. The general utility of the high-frequency module 1 is therefore improved.

Moreover, in the high-frequency module 1 according to the above described embodiment, since the wiring for interconnecting the front-end module section 4, the power amplifier module section 5, the LSI section 7 and the SAW filter module section 8 and the impedance matching sections 11 to 14 are built in the main module 60 together with the synthesizer module section 6, it is unnecessary to provide the wiring and the impedance matching sections on the mother board. Therefore, the area required for mounting the components can be markedly reduced in comparison with the case where components such as the front-end module section 4 and the like are individually mounted on the mother board.

Furthermore, since the external electrodes 85, 96, 101, 115 of the sub-module 80, the sub-module 90, the semiconductor chip package 100 and the sub-module 110 are provided on the bottom surfaces thereof, the inner dimensions of each of the first to fourth cavities 61 to 64 can be determined so as to be the substantially same as those of the corresponding one of the sub-module 80, the sub-module 90, the semiconductor chip package 100 and the sub-module 110. Therefore, the planar size of the main module 60 can be minimized.

Next, explanation will be made regarding another preferred embodiment of the present invention.

Figure 9:
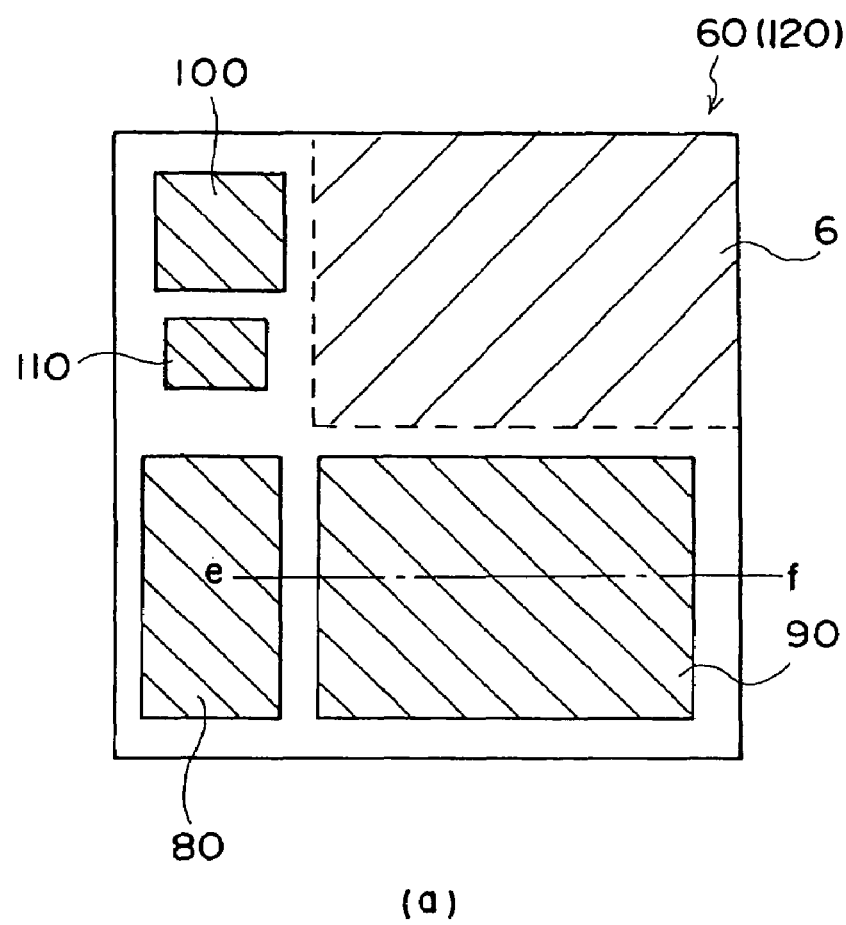
Figure 9:
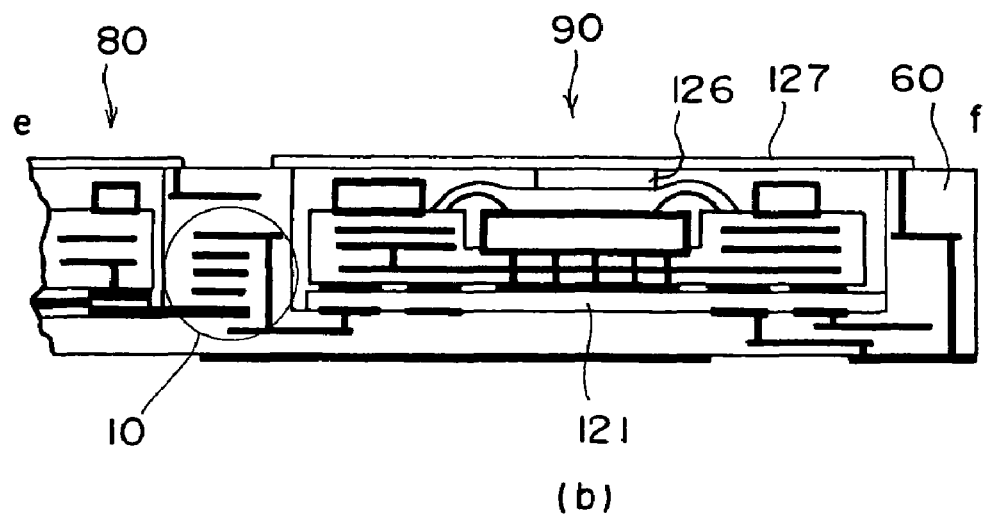

FIG. 9 shows the structure of a high-frequency module which is another embodiment of the present invention, wherein FIG. 9(a) is a plan view thereof and FIG. 9(b) is a cross sectional view taken along a line e–f in FIG. 9(a).

The high-frequency module 120 according to this embodiment is different from the high-frequency module in the above described embodiment in the method for connecting each of the sub-modules 80, 90 and 110 and the semiconductor chip package 100 with the main module 60.

Specifically, as shown in FIG. 9, in the high-frequency module 120 according to this embodiment, an anisotropic sheet 121 is disposed at connections between the main module 60, and the sub-modules 80, 90, 110 and the semiconductor chip package 100 and the main module 60, and the sub-modules 80, 90, 110 and the semiconductor chip package 100 are electrically connected via the anisotropic sheet 121.

Figure 10:
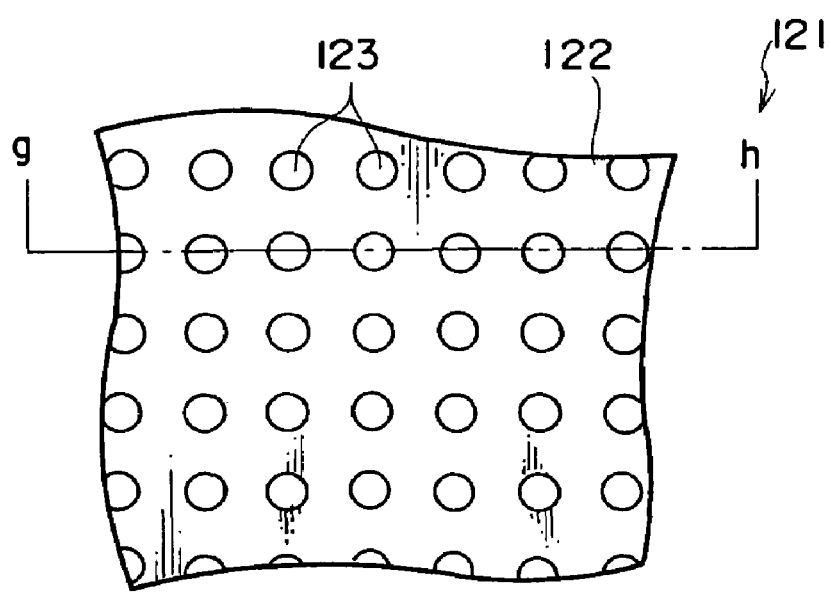
FIG. 10(a) is a plan view schematically showing an anisotropic sheet and FIG. 10(b) is a cross sectional view taken along a line g–h in FIG. 10(a).
Figure 10:
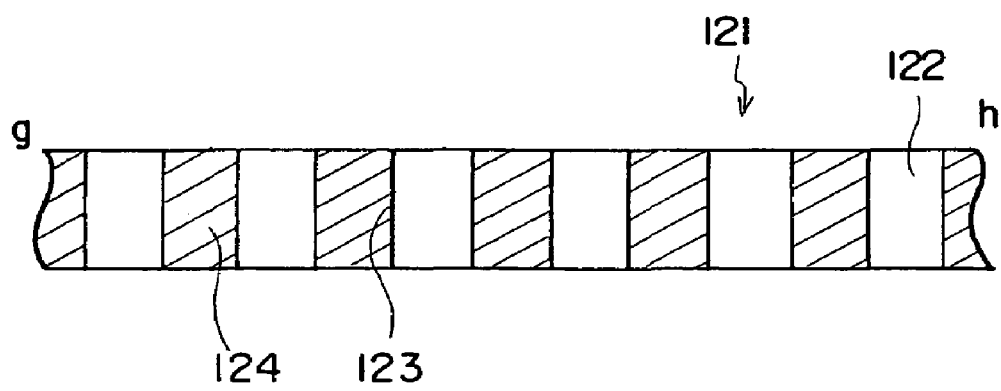

FIG. 10(a) is a plan view schematically showing the anisotropic sheet 121 and FIG. 10(b) is a cross sectional view taken along a line g-h in FIG. 10(a).

As shown in FIGS. 10(a) and 10(b), the anisotropic sheet 121 is constituted by forming a number of through holes 123 in an insulating film 122 having a thickness of about 0.2 mm so that they pass through from one side to the other side of the insulating film 122. The diameter of each of the through holes 123 and the distance between neighboring through holes 123 are respectively set to be sufficiently smaller than the diameter of the corresponding one of the external electrodes 85, 96, 101, 115 of the sub-modules 80, 90, the semiconductor chip package 100 and the sub-module 110 and the distance between neighboring external electrodes 85, 96, 101, 115 thereof. Conductive material 124 is charged in each of the through-holes 123 and electric conductivity from one side to the other side of the anisotropic sheet 121 is established by the conductive material 124 continuously charged in each of the through holes 123 from one side to the other side of the anisotropic sheet 121. The conductive material 124 is not particularly limited but gold is preferably used.

On the other hand, since the insulating film 122 that is the main body of the anisotropic sheet 121 is formed of an insulating material, the anisotropic sheet 121 performs as an insulator in the planar direction thereof. Therefore, the anisotropic sheet 121 has conductivity in the thickness direction thereof and an insulation property in the planar direction thereof.

Further, as shown in FIG. 9(b), in this embodiment, no metal cap is provided in the sub-module 90 and a metal plate 127 placed on the sub-module 90 via a fixed pad 126 after the sub-module 90 has been inserted into the second cavity 62 serves as the metal cap of the previous embodiment. Specifically, after the sub-module 90 has been inserted into the second cavity 62, the fixed pad 126 is placed on the upper surface portion of the sub-module 90 and the second cavity 62 is then blocked by the metal plate 127. At this time, ground potential is applied to the metal plate 127, because a ground pattern is formed at the part of the upper surface portion of the main module 60 that makes contact with the end portion of the metal plate 127. The sub-modules 80, 110 are similarly constituted.

The metal plate 127 and the ground pattern are connected via the anisotropic sheet 121 by using the metal plate 127 to apply pressure to the sub-modules 80, 90, 110 via the fixed pad 126 and fixing the end portion of the metal plate 127 and the ground pattern formed at the upper surface portion of the main module 60 with solder or the like. As a result, the main module 60 and each of the sub-modules 80, 90, 110 are connected by pressure bonding via the anisotropic sheet 121, thereby establishing electrical connection.

According to this embodiment, since the main module 60, and the sub-modules 80, 90, the semiconductor chip package 100 and the sub-module 110 are connected via the anisotropic sheet 121, it is unnecessary to form the solder bumps 65 to 68 on the bottom surfaces of the first to fourth cavities 61 to 64. Further, since the main module 60, and the sub-modules 80, 90, the semiconductor chip package 100 and the sub-module 110 are not soldered, any defective component discovered can be easily replaced even after the sub-modules 80, 90, the semiconductor chip package 100 and the sub-module 110 have been inserted into the first to fourth cavities 61 to 64 and sealed with the metal plates 127.

Further, according to this embodiment, the first to fourth cavities are blocked by the metal plates 127 so as to substantially air-tight seal the sub-modules 80, 90, the semiconductor chip package 100 and the sub-module 110 and thus prevent entry of foreign substances.

The present invention has thus been shown and described with reference to specific embodiments. However, it should be noted that the present invention is in no way limited to the details of the described arrangements but changes and modifications may be made without departing from the scope of the appended claims.

For example, in each of the high-frequency modules 1 and 120 according to the above described embodiments, the synthesizer module section 6 is built in the main module 60 and each of the front-end module section 4, the power amplifier module section 5, the synthesizer module section 6, the LSI section 7 and the SAW filter module section 8 is constituted as an independent sub-module or semiconductor chip package. However, the circuit section to be built in the main module 60 is not limited to the synthesizer module section 6 and some other circuit section may instead be built in the main module 60. Still, since the size of the main module 60 is larger than those of the sub-modules and the semiconductor chip package, it is preferable from the viewpoint of reducing the total weight of the high-frequency module 1, 120 to form the main module 60 of a light material such as resin and it is therefore preferable to select as the circuit section to be built in the main module 60 one that can be built in the multi-layered substrate formed of resin or the like.

Further, two or more circuit sections selected from among the front-end module section 4, the power amplifier module section 5, the synthesizer module section 6, the LSI section 7 and the SAW filter module section 8 may be built in the main module 60. If two or more circuit sections are built in the main module 60, the total size of the high-frequency module 1, 120 can be reduced but there is a risk of the production yield being lowered. Therefore, it is preferable to determine the number of circuit sections built in the main module 60 based upon the required size and yield.

Moreover, in each of the high-frequency modules 1 and 120 according to the above described embodiments, although all impedance matching sections 11 to 14 are built in the multi-layered substrate constituting the main module 60, it is not absolutely necessary to build all impedance matching sections 11 to 14 in the multi-layered substrate constituting the main module 60 and some or all of them may be constituted as electronic components mounted on the upper surface of the main module 60.

Furthermore, in the high-frequency module 1 according to the above described embodiment, although the solder bumps 65 to 68 are provided on the bottom surfaces of the first to fourth cavities 61 to 64, the solder bumps 65 to 68 may be provided on the sides of the sub-modules or the semiconductor chip package to be inserted into the first to fourth cavities 61 to 64 instead of providing them on the sides of the first to fourth cavities 61 to 64.

As described above, according to the present invention, since some circuit sections among a plurality of circuit sections for constituting a high-frequency module are built in a main module and other circuit sections are constituted as a sub-module or semiconductor chip package so as to be insertable into cavities formed in the main module, it is possible to prevent decrease the production yield of a high-frequency module including a number of circuit sections and to improve the general utility of the high-frequency module.

What is claimed is:

1. A high-frequency module comprising:
a main module including a first substrate formed with a cavity on an obverse surface thereof and an antenna terminal for connecting an antenna on a reverse surface thereof, a first electrode formed on a bottom surface of the cavity and an impedance matching circuit including a conductive pattern built in the first substrate and formed so as to connect the first electrode and the antenna terminal; and
a sub-module including a second substrate formed with a high-frequency circuit and a second electrode connected to the high-frequency circuit on a reverse surface thereof;
the sub-module being inserted into the cavity formed in the main module and the first electrode and the second electrode being electrically connected to each other.

2. A high-frequency module in accordance with claim 1, wherein the first substrate constituting the main module is constituted as a laminate of a plurality of resin substrates.

3. A high-frequency module in accordance with claim 1, wherein the second substrate constituting the sub-module is constituted as a laminate of a plurality of ceramic substrates.

4. A high-frequency module in accordance with claim 1, wherein the first electrode of the main module and the second electrode of the sub-module are electrically connected by solder.

5. A high-frequency module in accordance with claim 1, wherein the first electrode of the main module and the second electrode of the sub-module are electrically connected via an anisotropic conductive sheet.

6. A high-frequency module in accordance with claim 1, wherein an upper portion of the cavity into which the sub-module is inserted is covered by a metal plate.

7. A high-frequency module in accordance with claim 6, wherein the metal plate is connected to a ground pattern formed on an upper surface of the main module.

8. A high-frequency module comprising:
a main module including a first substrate formed with a cavity on a first surface thereof and an external terminal for connecting to a circuit board on a second surface thereof, a first electrode formed on a bottom surface of the cavity within the first substrate and a conductive pattern formed in the first substrate connecting the first electrode to the external terminal; and a sub-module including a second substrate formed with a high-frequency circuit on a first surface thereof and a second electrode connected to the high-frequency circuit on a second surface thereof, wherein the second surface is opposite the first surface; the sub-module being inserted into the cavity formed in the main module so that the first electrode and the second electrode are electrically connected to each other.

* * * * *